United States Patent [19]
Denissen et al.

[11] Patent Number: 5,671,236
[45] Date of Patent: Sep. 23, 1997

[54] APPARATUS AND METHODS FOR USE IN TRANSMITTING AND RECEIVING A DIGITAL SIGNAL, AND A RECORD CARRIER OBTAINED BY A TRANSMISSION APPARATUS OR METHOD

[75] Inventors: Adrianus J. M. Denissen; Ludovicus M. G. M. Tolhuizen, both of Eindhoven, Netherlands

[73] Assignee: U.S. Philips Corporation, New York, N.Y.

[21] Appl. No.: 401,760

[22] Filed: Mar. 9, 1995

[30] Foreign Application Priority Data

Mar. 9, 1994 [EP] European Pat. Off. ............ 94200590

[51] Int. Cl.⁶ ............ G11B 20/18; H03M 7/00; H03M 13/00; H04L 25/497
[52] U.S. Cl. ............ 371/37.1; 341/58; 371/40.1
[58] Field of Search ............ 371/37.1, 40.1; 341/58

[56] References Cited

U.S. PATENT DOCUMENTS 5,136,436  8/1992  Kahlman ............ 360/40
5,465,260  11/1995 Zook ............ 371/37.7

*Primary Examiner*—Stephen M. Baker
*Attorney, Agent, or Firm*—Michael E. Marion

[57] ABSTRACT

Apparatus and methods for transmitting and receiving a digital data signal. At the transmitter side, packets of p m-bit digital words in a digital signal are error protection encoded to produce error protection encoded packets of n m-bit digital words making up an error protection signal, where n>p. The error protection encoded packets are converted into converted packets of digital words to form a channel encoded signal, which signal is supplied to a transmission medium. The conversion involves use of a generator for supplying a fixed auxiliary packet of n digital words; a calculation unit for calculating in a Galois field $GF(2^m)$ a converted digital word in accordance with the formula $DW_i + \alpha.FW_i$, where $DW_i$ and $FW_i$ are the binary values corresponding to the i-th digital words in the packet to be converted and the auxiliary packet, respectively, $\alpha$ is a binary value, and the converted digital word is the i-th converted digital word in the converted packet, where i runs from 1 to n; and a digital sum value determining unit for determining the digital sum value of at least a converted packet in the channel encoded signal. The calculation unit determines a value $\alpha_{def}$ with the converted digital words obtained by the Galois field $GF(2^m)$ calculation of $DW_i + \alpha_{def}.FW_i$ so as to obtain the converted packet, the value $\alpha_{def}$ for $\alpha$ being such that a running digital sum value of the converted packets shows a desired pattern as a function of time. The receiver side operates in an opposite manner.

29 Claims, 4 Drawing Sheets

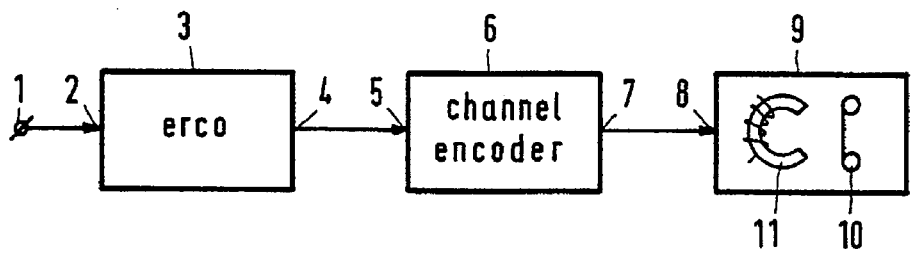
FIG.1A
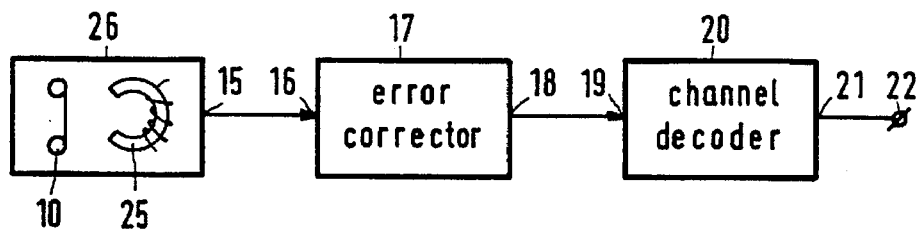
FIG.1B
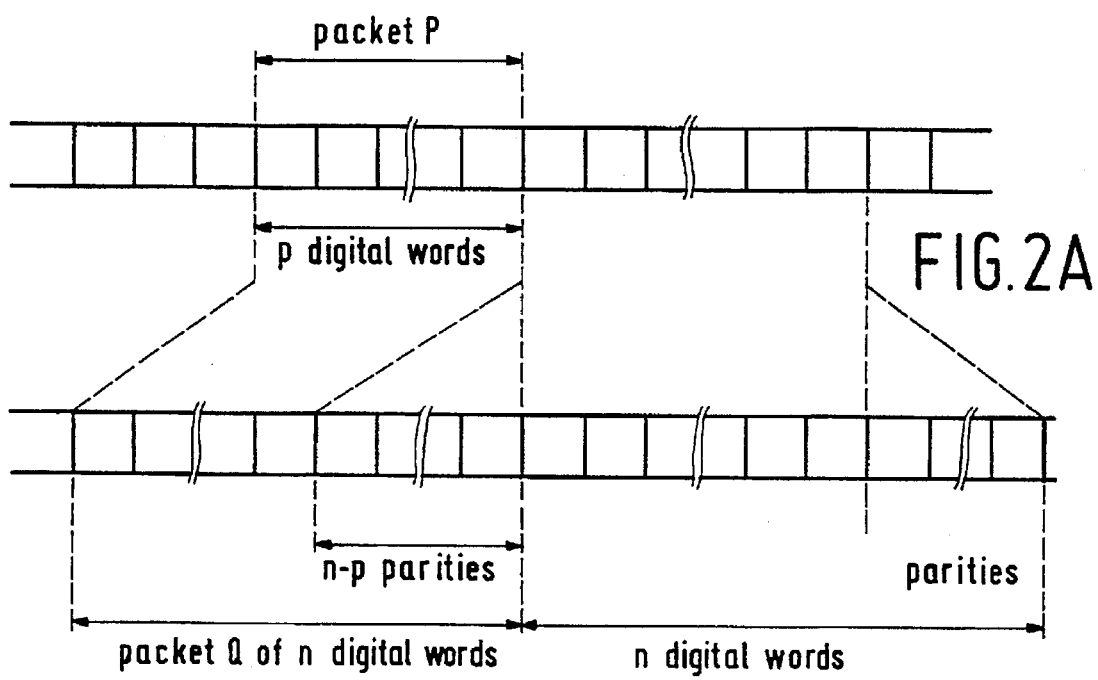
FIG.2A
FIG.2B

APPARATUS AND METHODS FOR USE IN TRANSMITTING AND RECEIVING A DIGITAL SIGNAL, AND A RECORD CARRIER OBTAINED BY A TRANSMISSION APPARATUS OR METHOD

BACKGROUND OF THE INVENTION

The invention relates to a transmitter apparatus, for transmitting a digital data signal via a transmission medium, the transmitter apparatus comprising input means for receiving the digital data signal, error protection encoding means for carrying out an error protection encoding on the digital data signal so as to obtain an error protection encoded digital data signal, channel encoding means for converting the error protection encoded digital data signal processed into a channel encoded digital data signal, transmission means for applying the channel encoded digital data signal to the transmission medium, and to a receiver apparatus. The invention also relates to a method for transmitting and a method for receiving the channel encoded signal generated by the transmitter. The invention further relates to a record carrier obtained by the method, in the case that the method for transmitting is in the form of a method for recording the channel encoded signal on a record carrier. The record carrier can be a magnetic record carrier or an optical record carrier. The data signal supplied to the transmitter apparatus can, as an example be a data compressed digital video signal.

A transmitter apparatus defined above, which is in the form of a recording apparatus for recording the digital data signal on a record carrier, such as a magnetic record carrier, is known from EP-A 492,704.

Embodiments of channel encoding means are disclosed in U.S. Pat. No. 5,136,436, EP-A 476,766 and EP-A 476,767. Further, reference is made to the publication 'DC-free coset codes' by R. H. Deng et al in IEEE Trans. on IT, Vol. 34, no. 4, July 1988, pp. 786–792, which also disclose a channel encoding for magnetic and optical recording.

SUMMARY OF THE INVENTION

The invention aims at providing another way of realizing a channel encoding. To that purpose, the transmitter apparatus is characterized in that the error protection encoding means is adapted to carry out an error protection encoding step on packets of p m-bit digital words in the digital data signal, and for supplying error protection encoded packets of n m-bit digital words to an output, where n, m and p are integers, larger than 1, and n>p, the channel encoding means being adapted to convert the error protection encoded packets of n digital words into convened packets of digital words to form the channel encoded digital data signal, the channel encoding means comprising generator means for supplying a fixed auxiliary packet also having the length of n digital words, the channel encoding means further comprising calculation means for calculating in a Galois field $GF(2^m)$ a converted digital word $CW_i$ in accordance with the formula $DW_i + \alpha \cdot FW_i$, where $DW_i$ is the binary value corresponding to the i-th digital word in the packet, $FW_i$ is the fixed binary value corresponding to the i-th digital word in the fixed auxiliary packet, and $CW_i$ is the binary value of the i-th converted digital word in the converted packet of digital words, where i is an integer value running from 1 to n, the channel encoding means further comprising digital sum value determining means for determining a digital sum value of at least a converted packet in the serial datastream of the sequence of converted packets of digital words that form the channel encoded digital data signal, the calculation means being further adapted to determine a value $\alpha_{def}$ for each packet of digital words converted into a converted packet of digital words, the channel encoding means being further adapted to combine $\alpha_{def}$ with the converted digital words $CW_i$ obtained by the Galois field $GF(2^m)$ calculation of $DW_i + \alpha_{def} FW_i$, so as to obtain said converted packet of digital words, the value $\alpha_{def}$ for $\alpha$ being such that a running digital sum value of the serial datastream of the converted packets shows a desired pattern as a function of time.

The invention is based on the recognition that the known channel encoding algorithms have not always a very high efficiency. For instance, in U.S. Pat. No. 5,136,436, a discussion can be found concerning the efficiency of various channel encoding algorithms. As an example, a 8-to-10 conversion results in an efficiency of 80%, whereas a 9-to-10 conversion results in an efficiency of 90%. An improvement of efficiency was obtained with the 24-to-25 conversion algorithm of EP-476-767. The efficiency has increased to a value between 96 and 97%.

With the present invention, however, even higher efficiencies are possible. Suppose that m equals 8. That is, 256 possible values for $\alpha$ exist. The number of digital words in the converted packet must thus be lower than 256. However, the number of words in a converted packet generated by the channel encoding means is dependent on the number of constraints that should be satisfied by each of the converted packets in the channel encoded signal. Or, if the number of constraints is high(er), the number of words in the packet will be low(er).

One constraint, well known from the prior art, is the requirement that the resulting channel encoded signal is DC free. Another requirement is the embedding of one or more pilot signals in the digital datastream of the channel encoded signal, so as to enable tracking during reproduction. Again other constraints are a specific maximum runlength $T_{max}$ and a specific minimum runlength $T_{min}$ for the channel encoded signal. Further, where the converted packet includes a sync word, it is sometimes (but not always) required that the bit pattern of the sync word is not present elsewhere in the converted packet. All these requirements result in values for a that are not acceptable.

Investigations have led to a realization of a channel encoder in accordance with the invention where the packet comprises in the order of 75 digital words, and where still one or more values for $\alpha$ have remained as acceptable values. Consequently, the efficiency of this channel encoder has increased to between 98 and 99%.

Further, by carrying out the algorithm as claimed, this provides an error protection on the value $\alpha_{def}$ transmitted, so that the value for $\alpha_{def}$ is less vulnerable to errors occurring during the transmission and reception (recording and reproduction) step.

It will be apparent that such increase in efficiency can only be obtained by a more complex encoding in the channel encoding means. The channel decoding means can however be very simple.

A receiver apparatus in accordance with the invention carries out a signal processing on the transmitted signal so as to regenerate a replica of the original digital data signal.

The receiver apparatus for receiving a digital data signal that has been transmitted as a serial datastream of converted packets via the transmission medium by means of the transmitter apparatus as claimed in anyone of the preceding claims, the receiver apparatus comprising receiving means for receiving a transmission signal from the transmission medium so as to obtain a replica of the serial datastream of converted packets at an output, channel decoding means for converting a channel encoded signal into a channel decoded signal, error correction decoding means for carrying out an error detection and correction on the signal applied to its input, is characterized in that the input of the error correction decoding means is coupled to the output of the reproducing means, an output of the error correction decoding means is coupled to an input of the channel decoding means, the digital data signal being available at an output of the channel decoding means, that the channel decoding means are adapted to reconvert packets of digital words, each packet comprising a value for α and n m-bit converted digital words, where n and m are integers larger than 1, the channel decoding means comprising retrieval means for retrieving the value α, one α for each of the packets, from the information applied to the input of the channel decoding means, and generator means for supplying a fixed auxiliary packet also having the length of n digital words, calculation means for calculating in a Galois field $GF(2^m)$ reconverted words in accordance with the formula $CW_i - \alpha.FW_i$, where $CW_i$ is the binary value corresponding to the i-th digital word in the packet and $FW_i$ is the fixed binary value corresponding to the i-th digital word in the fixed auxiliary packet, where i is an integer value running from 1 to n. A specific feature of the receiver apparatus is that the channel decoding means, which is normally positioned before the error correction decoding means, is now preceded by the error correction decoding means. As a result of the algorithm in the channel encoding means in the transmitter apparatus carried out on the packets of n digital words, the adding of the α value so as to obtain the converted packet is a linear process, so that carrying out the error correction decoding on the complete converted packet means that also a correction on α is carried out.

It should be noted that, where main claim 1 claims the channel encoding so as to realize a running digital sum such that it shows a desired pattern as a function of time, the invention equally well lies in carrying out the channel encoding for realizing solely (or in combination with an other requirement) the requirement for the maximum runlength in the channel encoded signal, or for realizing solely (or in combination with an other requirement) the requirement for the minimum runlength in the channel encoded signal, or for realizing solely (or in combination an other requirement) the requirement that only a certain maximum number of '01' combinations may occur directly after each other in the serial datastream of the channel encoded signal.

BRIEF DESCRIPTION OF THE DRAWINGS

These and other aspects of the invention will be further elucidated with reference to the embodiments shown in the drawings in which:

FIG. 1a shows an embodiment of a transmitter apparatus, which is in the form of a recording apparatus, and FIG. 1b shows an embodiment of a receiver apparatus, which is in the form of a reproducing apparatus, FIG. 2a shows a serial datastream of an input data signal of a recording apparatus, and FIG. 2b shows a serial datastream of an output signal of the error correction encoding unit in a recording apparatus;

DESCRIPTION OF THE PREFERRED EMBODIMENTS

Figure 3:
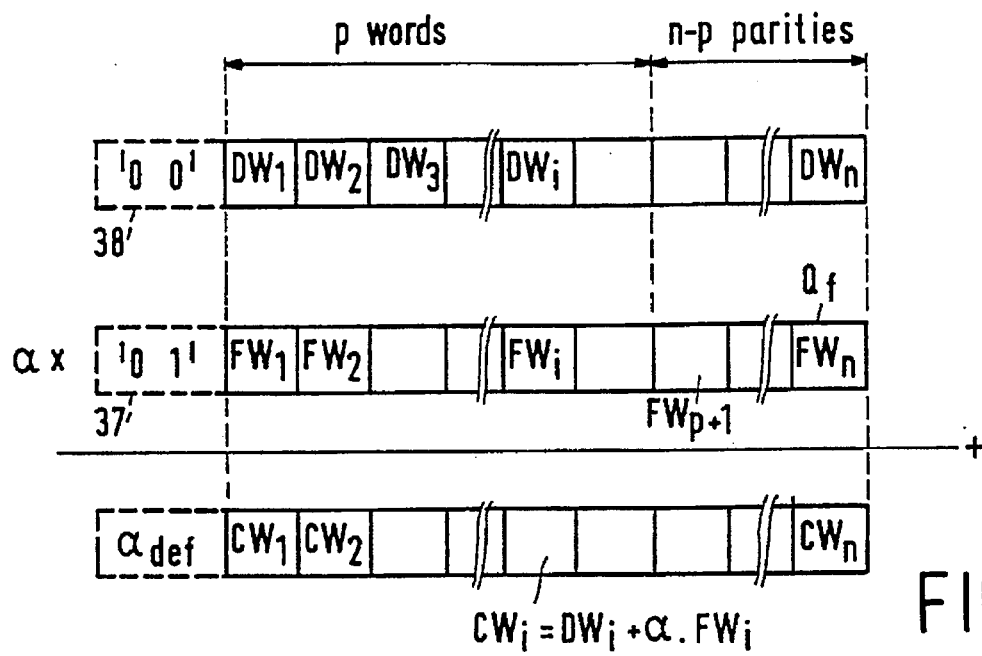
FIG. 3 shows a conversion carried out in a channel encoding unit in the recording apparatus.

FIG. 1a shows schematically and in block diagram an embodiment of the transmitter apparatus, which is in the form of a recording apparatus for recording the digital data signal on a magnetic record carrier. The recording apparatus has an input terminal 1 which is coupled to an input 2 of an error correction encoding unit 3, an output 4 of which is coupled to an input 5 of a channel encoder unit 6. An output 7 of the channel encoder unit 6 is coupled to an input 8 of a recording unit 9, which is adapted to record the output signal of the encoder unit 6 on a magnetic record carrier 10, by means of at least one write head 11.

FIG. 1b shows schematically and in block diagram an embodiment of the receiver apparatus, which is in the form of a reproduction apparatus for reproducing the signal recorded by the apparatus of FIG. 1a on the record carrier 10 from that record carrier. The reproducing apparatus comprises a reproducing unit 26 which is adapted to read information from a track on the record carrier 10 by means of a read head 25. An output 15 of the reproducing unit 26 is coupled to an input 16 of an error corrector 17. An output 18 of the error corrector 17 is coupled to an input 19 of a channel decoding unit 20, an output 21 of which is coupled to the output terminal 22 of the reproducing apparatus.

Special attention should be paid to the sequence in which the units are serially arranged in the recording apparatus of FIG. 1a and the reproducing apparatus of FIG. 1b. The recording apparatus of FIG. 1a has the error correction encoding unit 3 and the channel encoding unit 6 in their normal order. It is expected that, in order to carry out the inverse signal processing in the reproducing apparatus, the channel decoder unit 20 should be followed by the error correction decoding unit 17. FIG. 1b however shows that this order is reversed. Because of the specific signal processing carried out in the channel encoder unit 6, as will be explained later, it has become possible to exchange the order of the serial arrangement of the channel decoder unit 20 and the error correction unit 17, so that an error correction step can be realized on the $\alpha_{def}$ values to be explained later, resulting in a better protection of the $\alpha_{def}$ values transmitted.

In the error correction encoder 3, an error correction encoding is carried out on each time a packet P of p digital words (bytes), of 8 bit each. FIG. 2a shows the serial datastream of the 8-bit words applied to the input terminal 1. As a result of the error correction encoding, n-p parity bytes are added to the packet of bytes, so as to obtain subsequent packets Q of n digital words (bytes) of 8 bit each. This is shown in FIG. 2b. The serial datastream in FIG. 2b is shown on an expanded timescale. It should however be understood that the length of time of the packets Q in FIG.

2b is the same as the length of time of the packets P in FIG. 2a. Thus, an increase in bitrate has occurred in the output signal of the error correction encoder 3, because of the adding of the parity bytes.

The packets Q, generated by the encoder 3 are supplied to the channel encoder unit 6. The channel encoder 6 is needed so as to convert the serial datastream of digital words supplied by the encoder 3 into a convened datastream that can be supplied to the transmission channel, and is adapted to the characteristics of the transmission channel: that is in the present case the magnetic recording channel.

The characteristics of the transmission channel pose constraints on the signal that is applied to the input 8 of the recording unit 9.

One requirement is that the serial datastream applied to the recording unit 9 should be DC free. This can generally be realized by channel encoding 'blocks of data' into converted blocks of data that have a disparity of zero. The disparity is defined as the digital sum value (or DSV) over the whole 'block of data' in question. These 'block of data' will be the convened packets to be described later.

Another requirement is to embed a pilot signal of relatively low frequency compared to the frequencies normally present in the serial datastream, in the said datastream so as to enable tracking during reproduction. This can be realized by computing the running digital sum value (or RDSV) of the channel encoded signal and to channel encode 'blocks of data' into convened blocks of data so that the running digital sum value behaves as the said pilot signal.

A further requirement is that the channel encoded signal should satisfy a certain minimum and maximum runlength $T_{min}$ and $T_{max}$ respectively. The requirement of $T_{min}$ means that the minimum number of successive 'zeros' or 'ones' that is allowed in the serial datastream of the channel encoded signal is $T_{min}$, and the requirement of $T_{max}$ means that the maximum number of successive 'zeros' or 'ones' that is allowed in the serial datastream of the channel encoded signal is $T_{max}$.

Again another requirement has a relation to the sync words that are regularly inserted in the serial datastream so as to obtain the channel encoded signal for the recording unit 9. Sometimes it is required that, apart from the sync word in the channel encoded signal, the serial datastream of the channel encoded signal does not include bit patterns that are the same as the bit pattern of the sync word.

Channel encoding carded out in the channel encoder unit 6 results in a computation to be carded out on the packets of n digital words, denoted $DW_1$ to $DW_n$, as will be explained with reference to FIG. 3. A fixed packet $Q_f$ of n fixed 8-bit digital words $FW_1$ to $FW_n$ is available in the channel encoder 6. The fixed packet has been obtained as follows.

The p digital words $FW_1$ to $FW_p$ can be chosen more or less freely. Preferably, all the digital words are chosen unequal to each other.

Next, the n-p digital words $FW_{p+1}$ to $FW_n$ are obtained by carrying out the same error correction encoding on the following packet of words

['01'(hex), $FW_1, FW_2, \ldots, FW_p$]

as has been carried out in the error correction encoder 3 on the packets P. FIG. 3 shows this packet of words in the centre line, where the block 37 given in broken lines indicates the digital word '01' (hex) that has been added fictitiously in front of the packet of words $FW_1$ to $FW_p$.

It should be noted here that calculating the parity words $FW_{p+1}$ to $FW_n$ using the packet of words ['01'(hex),$FW_1$, . . . ,$FW_p$], results in different parity words $FW_{p+1}$ to $FW_n$ then if the parity words would have been calculated using the packet of words [$FW_1, \ldots, FW_p$].

It should further be noted that, because of the linearity of the processing in the encoder 3, carrying out an error correction encoding in the encoder 3 on the packet P [$DW_1, \ldots, DW_p$] having p digital words, results in the same n-p parity words, as if the same error correction encoding would have been carried out on a packet P', being the packet P and having one additional digital word '00' (hex) added in front of the packet P, that is the packet ['00'(hex),$DW_1, \ldots, DW_p$]. This packet is shown in FIG. 3, the top line, where the block 38 given in broken lines indicates the added word '00' (hex).

Adding the digital word '01' (hex) to the p digital words $FW_1$ to $FW_p$ for calculating the parity words $FW_{p+1}$ to $FW_n$ in the fixed packet $Q_f$, results in the fact that, as will be explained later, the value $\alpha_{def}$ has been error correction encoded, so that an error correction step can be applied during reproduction on $\alpha_{def}$.

With the fixed packet $Q_f$ so obtained, corresponding words $DW_i$ and $FW_i$ of the packets Q and $Q_f$ are added in conformity with the following formula, so as to obtain convened digital words $CW_i$:

$$DW_i + \alpha.FW_i = CW_i,$$

where $\alpha$ is a constant. Calculations are carried out in the Galois field $GF(2^m)$, where m=8 in the present case. Otherwise said, calculations are carried out on $DW_i$ and $FW_i$, where the values for $DW_i$ and $FW_i$ are elements of a closed set of values, and where the resulting values $CW_i$ of the calculation are elements from the same closed set of values. As a result, the words $CW_i$ are again 8-bit digital words, just as the words $DW_i$ and $FW_i$ (in the present example). Reference is made in this respect to the book 'Introduction to the 4:2:2 digital video tape recorder' by Stephen Gregory, Pentech Press London, 1988, more specifically, the appendix A in that book on p. 172 to 189.

Figure 4:
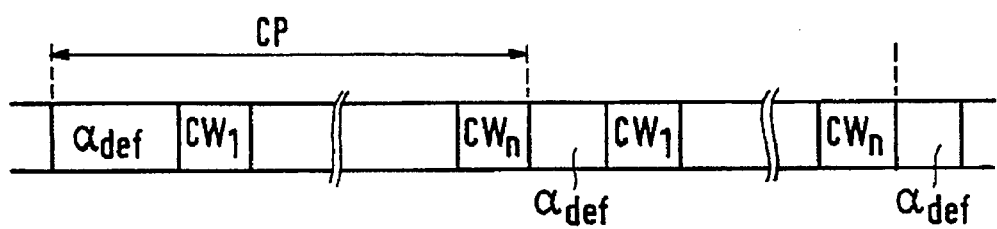
FIG. 4 shows a serial datastream of an output signal of a channel encoding unit in a recording apparatus.

The algorithm is carried out in the channel encoder unit 6 for a certain value for $\alpha$ so as to obtain a converted packet CP, as shown in the lowest line of FIG. 3 and 4.

Suppose for the moment that the channel encoding should result in a DC free output signal of the encoder 6. Now, the disparity of the converted packet obtained for a certain value of $\alpha$ is calculated by adding all 'ones' in the converted packet and subtracting a value of one for each of the 'zeros' in the converted packet. If the disparity thus calculated equals zero, the value for $\alpha$ is accepted as an acceptable value for $\alpha$ for obtaining the converted packet. If the disparity thus calculated is unequal to zero, the value for $\alpha$ is considered inadmissible. Another value for $\alpha$ is now chosen and, again, it is determined whether the disparity of the converted packet obtained with the other value for $\alpha$ is zero. If so, this other value for $\alpha$ is accepted. If not, the previous procedure is repeated unless an acceptable value for $\alpha$ has been found.

Figure 5:
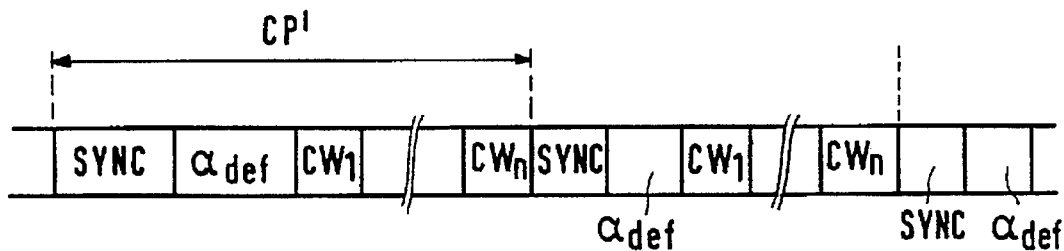
FIG. 5 shows another format for a serial datastream of an output signal of a channel encoding unit in a recording apparatus.

If the channel encoding unit 6 is also capable of adding a sync word to the packet CP, the channel encoding unit 6 generates converted packets CP' as shown in FIG. 5 at its output 7. In this situation, the disparity of the converted packet CP', including the sync word, is calculated so as to determine whether the value for $\alpha$ is acceptable.

If further constraints should be satisfied, such as the requirement that the channel encoded signal should satisfy a certain $T_{min}$, the converted packet CP (or CP') is checked for the smallest sequence of 'ones' or 'zeros' in the packet. If the number of consecutive 'ones' or zeros' in said sequence is larger than or equal to $T_{min}$, the value for $\alpha$ is accepted. If not, the value for $\alpha$ is rejected. In the same way, if the channel encoded signal should satisfy a certain $T_{max}$, the converted packet CP (or CP') is checked for the longest sequence of 'ones' or 'zeros' in the packet. If the number of consecutive 'ones' or zeros' in said sequence is smaller than or equal to $T_{max}$, the value for $\alpha$ is accepted. If not, the value for $\alpha$ is rejected.

If the portion of the converted packet CP' exclusive the sync word, is not allowed to have a bit pattern that equals the bit pattern of the sync word, this portion is checked for the occurrence of said bit pattern. If such bit pattern is detected, the value for $\alpha$ is rejected as being inadmissible. If no such bit pattern is detected, the value for $\alpha$ is accepted.

There is another way to make sure that the serial datastream of the channel encoded output signal of the channel encoder 6 does not comprise a data pattern that equals the data pattern of the sync word, except for those locations where the sync words are inserted. In this case, the data pattern of the sync word is chosen to be equal to a number of 'zeros' or ones' larger than the maximum number of 'zeros' or 'ones' ($T_{max}$) that is allowed in the serial datastream. A channel encoding based on the requirement of $T_{max}$ and carried out on the converted packets CP (that is without the sync words) as explained above, will now take care of the fact that the converted packets CP will never have a data pattern equal to the data pattern of the sync words. This way of satisfying the requirement that the serial datastream does not comprise a data pattern equal to the data pattern of the sync words, except at the locations of the sync words, has the advantage that less values for $\alpha$ are decided as being unacceptable. This for the reason that the channel encoding based on the $T_{max}$ requirement already results in the requirement for the sync word pattern being met.

In the case that a pilot signal should be embedded in the serial datastream of the channel encoded signal, the running digital sum value of the channel encoded signal should be determined and for each packet to be converted it is determined how value for the disparity of the resulting converted packet CP (or CP') should be in order to obtain the pilot signal of relatively low frequency compared to the frequencies present in the channel encoded signal. Such a value for $\alpha$ will be chosen that realizes the disparity required for the converted packet.

The search for an admissible value for $\alpha$ can stop as soon as one such value has been found that satisfies all constraints posed on the channel encoded signal. This one is denoted $\alpha_{def}$. Next, the converted packet CP (or CP') obtained using $\alpha_{def}$ is supplied to the output 7. That is: all converted words $CW_i$ obtained by carrying out the computation $$DW_i + \alpha_{def} FW_i = CW_i$$

together with the value $\alpha_{def}$ are combined, and if necessary also combined with the sync word, so as to obtain the converted packet CP or CP' respectively. This process is repeated for subsequent packets. As a result, the serial datastream as shown in FIGS. 3 and 4 respectively is obtained.

In the foregoing it is assumed that, as soon as a valid value for $\alpha$ has been found, this value for $\alpha$ is chosen as the value $\alpha_{def}$. It is however also possible to determine the converted packet for all the possible values for $\alpha$. Let us assume that the various requirements result in a deletion of a number of $\alpha$ values, but not all of them, so that a number of at least two values of acceptable $\alpha$ values remain. Now that value for $\alpha$ is chosen as $\alpha_{def}$ which satisfies the various requirements the best. Suppose we consider the requirement that the running digital sum of the serial datastream of the converted packets should result in a pilot signal of a certain frequency being embedded in the serial datastream. One can now take that $\alpha$ value as $\alpha_{def}$ for which the running digital sum of the serial datastream, also within the last packet converted, gives the best approximation of the desired pattern of the pilot signal as a function of time. This means, as an example, that for each acceptable value of $\alpha$, the squared difference between the actual pattern of the running digital sum within a convened packet, and the desired pattern of the running digital sum is determined, integrated over the said converted packet, and that that value for $\alpha$ is taken as the value $\alpha_{def}$ for which the integrated squared difference is the lowest.

The calculation explained above with reference to FIG. 3, can be interpreted in a different way, namely in that the following calculation is carried out:

$$['00'(hex), DW_1, \ldots, DW_n] + \alpha_{def} \cdot ['01'(hex), FW_1, \ldots, FW_n] =$$
$$= [\alpha_{def}(hex), CW_1, \ldots, CW_n].$$

It will be clear that, when starting the calculation for determining those values for $\alpha$ that are admissible, the value '00'(hex) can already be deleted from the available group of values for $\alpha$, as a multiplication with zero means that no conversion at all is carried out in the channel encoder 6.

It will be understood that sufficient values for $\alpha$ must be present in order to have at least one value for $\alpha$ left at the end of the computation carried out on a packet Q. With an 8-bit digital word for $\alpha$, this means that 255 possible values for $\alpha$ are present. The more constraints are posed on the channel encoded signal, the lower are the number n of data words in the packet Q in order that at in the end at least one value for $\alpha$ is admissible for the channel encoding of each of the packets Q. Investigations have led to a situation where n can be 75, when all the constraints discussed above are present. The efficiency of such channel encoding is rather high: between 98 and 99%.

It should be noted that, in order to error protect $\alpha_{def}$, one could have tried to carried out an error correction encoding after the converter 6. This would however have led to the generation of parity words that would violate the various constraints discussed above. Therefore, the error correction encoding is carried out prior to conversion in the converter 6. However, in the way as explained above in which the fixed packet $Q_f$ has been derived, this has led to a datastream that is error protected, inclusive the words $\alpha_{def}$.

Figure 6:
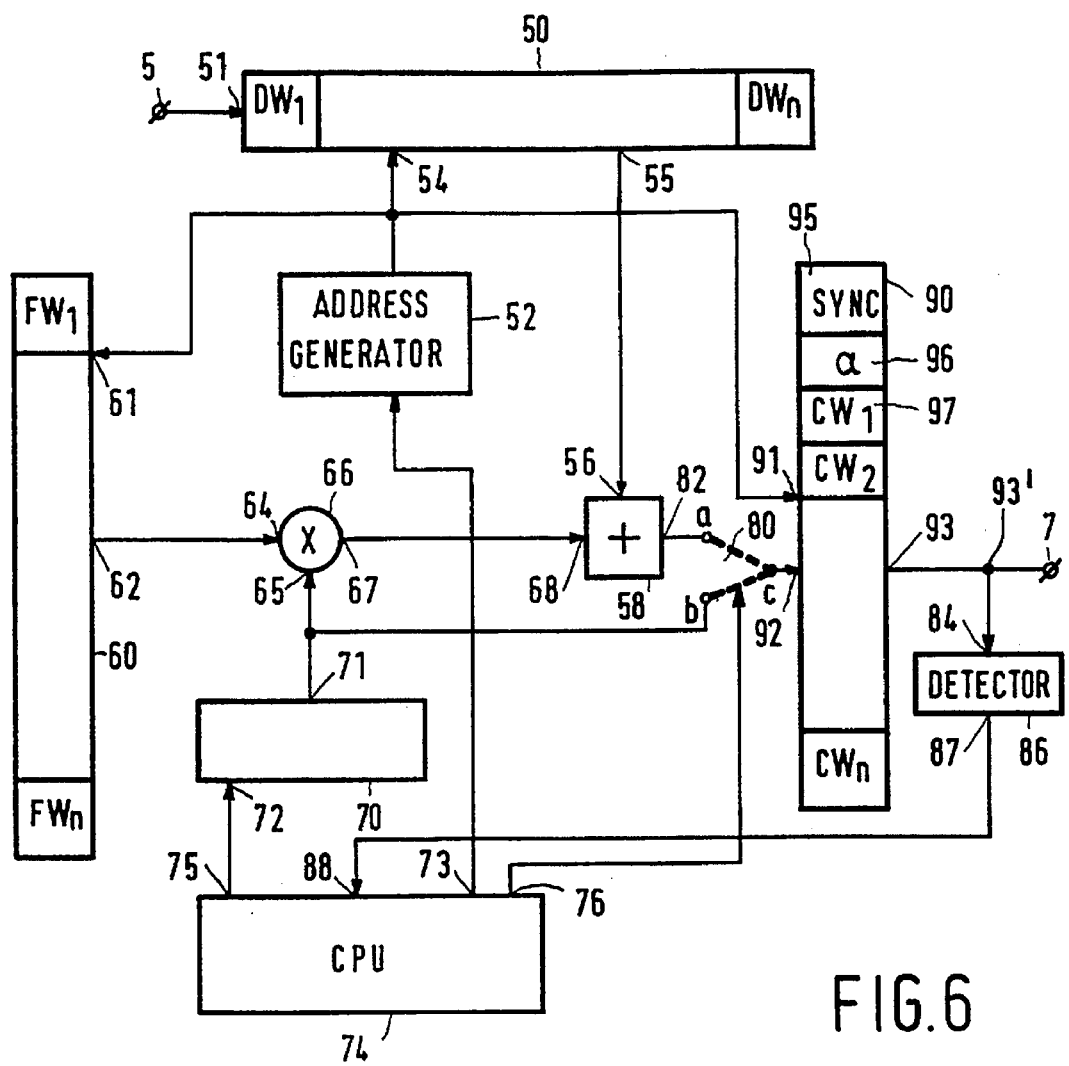
FIG. 6 shows an embodiment of a channel encoder unit in the recording apparatus.

FIG. 6 shows an embodiment of the channel encoder unit 6. The channel encoder unit 6 comprises a memory 50 having an input 51 coupled to the input terminal 5. A packet Q of n digital words $DW_1$ to $DW_n$ can be stored in the memory 50 under the influence of addresses supplied by an address generator 52 to an address input 54. An output 55 of the memory 50 is coupled to an input 56 of an adder unit 58. The channel encoder unit further comprises a memory 60 in which the fixed packet $Q_f$ of words $FW_1$ to $FW_n$ is stored. Addresses generated by the address generator 52 are also supplied to an address input 61 of the memory 60. An output 62 of the memory 60 is coupled to an input 64 of a multiplier 66, an output 67 of which is coupled to an input 68 of the adder unit 58. A generator unit 70 for generating the values for $\alpha$ is available, an output 71 of which is coupled to an input 65 of the multiplier 66. As has been explained previously, the generator 70 does not generate the value '00'(hex). Further, a memory 90 is present having a data input 92 coupled to a fixed terminal c of a controllable switch 80, and an address signal input 91 coupled to the output of the address generator 52. An output 93 of the memory 90 is coupled to the output 7 of the channel encoder as well as to an input 84 of a detector unit 86.

The output 82 of the adder unit 58 is coupled to the a-terminal of the switch 80. The b-terminal of the switch 80 is coupled to the output of the generator 70.

The memory 90 has stored in a memory location indicated by 95 the bit pattern corresponding to the sync word.

A control signal is supplied to a control signal input 72 by a central processing unit 74. A control signal is supplied by the CPU 74 via an output 73 to the address generator 52, in order for the address generator 52 to supply subsequent addresses for the memories 50 and 60. A further control signal is supplied by the CPU 74 for the controllable switch 80. The detector 86 has an output which is coupled to a control input 88 of the CPU 74.

It is assumed that a packet Q has been stored in the memory 50. The procedure starts in that a control signal is generated by the CPU 74 at its outputs 75 and 76. Under the influence of the control signal generated at the output 75, the generator 70 generates the first possible value for $\alpha$ at its output 71. Under the influence of the control signal present at the output 76, the switch is switched to the position b-c, so that the value for $\alpha$ is applied to the input 92 of the memory 90. An address is generated by the address generator 52 under the influence of a control signal from the CPU 74, so that the memory location 96 in the memory 90 is addressed. The value for $\alpha$ present at the input 92 is now stored in the memory location 96, under the influence of a control signal (not shown) from the CPU 74. Next, an address is generated by the address generator 52 under the influence of a control signal from the CPU 74 so that the first memory locations in the memories 50 and 60 are addressed. The first digital word $DW_1$ and the first fixed word $FW_1$ are supplied to the outputs 55 and 62 respectively. The first value for $\alpha$ is also applied to the input 65 of the multiplier unit 66. At the output 67 of the multiplier unit 66, the value $\alpha.FW_1$ is now available, so that the value $DW_1+\alpha.FW_1$ is supplied to the output 82 of the adder unit 58. Under the influence of a control signal present at the output 76, the switch 80 switches over to the position a-c and remains in this position. The convened codeword $CW_1$ is now applied to the input 92 of the memory 90 and stored in the next position, indicated by 97 in the memory 90.

Next, the following address is generated by the address generator 52 under the influence of a control signal from the CPU 74, so that the second memory locations in the memories 50 and 60 are addressed. The second digital word $DW_2$ and the second fixed word $FW_2$ are supplied to the outputs 55 and 62 respectively. For the same value of $\alpha$, the next converted word $CW_2$ is now obtained, presented to the input 92 of the memory 90 and stored in the next position in the memory 90.

This is repeated for all n codewords, so that in the end the converted codeword $CW_n$ is stored in the memory 90.

Under the influence of a control signal (not shown) from the CPU 74, the contents of the memory 90 is now applied to the detector unit 86. The detector unit 86 checks whether the converted packet CP' violates one of the constraint that are posed on the channel encoded signal. If none of the constraints are violated, the detector unit 86 generates a first control signal is generated at the output 87, which control signal is applied to the input 88 of the CPU 74. The value for $\alpha$ is accepted as $\alpha_{def}$ and the converted packet stored in the memory 90 is supplied to the output 7.

If one of the constraints are violated, the detector unit 86 generates a second control signal at its output 87, which second control signal is applied to the input 88 of CPU 74.

The value for $\alpha$, stored in the location 96 is now rejected as being non-acceptable.

Upon reception of the second control signal, the CPU 74 generates a control signal at the output 75, under the influence of which the generator 70 generates the next value for $\alpha$ at its output 71. This next value for $\alpha$ is stored in the location 96. Next converted codewords $CW_i$ are calculated using the new value for $\alpha$ and stored in the memory 90. Again, the detector 86 detects whether one of the constraints are violated by the newly calculated converted packet. If none of the constraints are violated, the new value for $\alpha$ is accepted as $\alpha_{def}$. If at least one of the constraints is violated, the new value for $\alpha$ is also rejected. The procedure will now be repeated with again another value for $\alpha$, until an acceptable value for $\alpha$ is found.

After having supplied the converted packet CP' to the output 7, the procedure is repeated for a new packet Q of digital words that are stored in the memory 50 so as to generate the next converted packet CP' at the output 7.

It should be noted that, if required, a 1T precoder or a 2T precoder can be inserted between the output 93 of the memory 90 and the terminal 93' or between the terminal 93' and the terminal 7. 1T precoders and 2T precoders are well known in the art, so need no further clarification.

Figure 7:
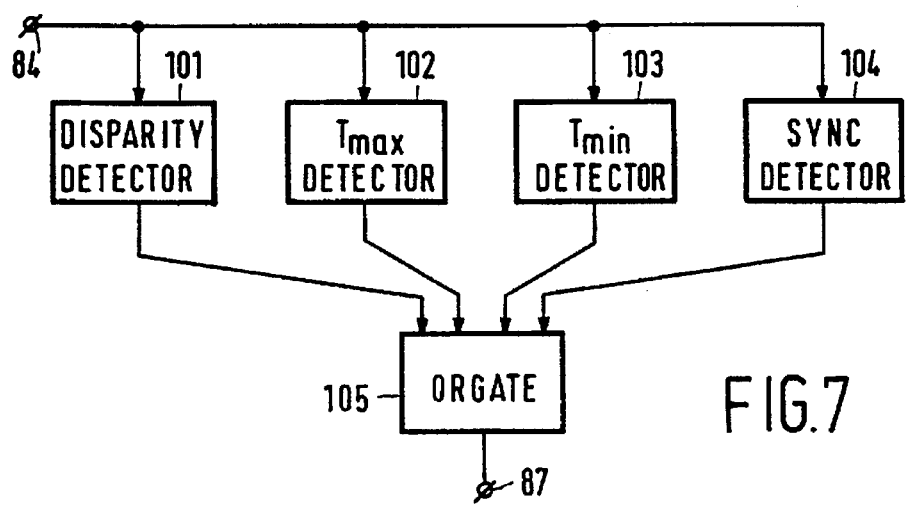
FIG. 7 shows an embodiment of a detector 86 of FIG. 6.

FIG. 7 shows schematically an embodiment of the detector 86 of FIG. 6. The detector of FIG. 7 is adapted to detect a violation of four constraints. The first constraint is that the disparity of the converted packet CP' should be zero. To that purpose, the detector comprises a disparity detector 101. The second constraint is that the serial datastream of the converted packets should obey a certain $T_{max}$. To that purpose, a $T_{max}$ detector 102 is present. The third constraint is that the serial datastream of the convened packets should obey a certain $T_{min}$. To that purpose, a $T_{min}$ detector 103 is present. Further, apart from the presence of the sync word, no bit pattern corresponding to the bit pattern of the sync word is allowed to occur in the converted packet. To that purpose a comparator 104 is present for comparing the datastream of the converted packets with the syncword. The inputs of all elements included in the detector of FIG. 7 are coupled to the input 84 of the detector 86. Outputs of the elements 101 to 104 are coupled to corresponding inputs of an OR gate 105, which has an output coupled to the output 87 of the detector 86. Upon detecting a violation of a constraint, an element of the detector 86 generates a '1' binary signal at its output, so that a '1' binary signal at the output 87 signifies a violation of one of the constraints.

If the aT precoder mentioned above, where a equals 1 or 2, is included between the terminals 93' and 7, the $T_{max}$ detector 102 only needs to detect whether groups of subsequent 'zeroes' between two subsequent 'ones' include more than a specified first number of zeroes', which specified first number is related to the value $T_{max}$. If the aT precoder mentioned above is included between the output 93 and the terminal 93', the $T_{max}$ detector 102 needs to detect whether groups of subsequent 'zeroes' and groups of subsequent 'ones' include more than a specified second number of 'zeroes' and 'ones' respectively, which specified second number is also related to the value $T_{max}$. More specifically, the specified first number equals the specified second number minus the value a.

The reproduction in the reproducing apparatus of FIG. 1b will now be explained. Not shown in FIG. 1b, but present if a packet CP' including a sync word is received, is a sync detector 110 (see FIG. 8), which has an input 112 coupled to the output 15 of the reproducing unit 26 of FIG. 1b, for synchronising the reproducing apparatus. Upon the detection of a sync word, a sync detection signal is supplied to an input 114 of the central processing unit 74'. Upon receiving a sync detection signal, the cpu 74' generates a control signal (not shown) for the error correction unit 17 of FIG. 1b, so that error detection and error correction in the corrector 17 is carried out each time a packet CP'. This packet includes n+1 data words, where the first data word is the value $\alpha_{def}$ which is followed by p words $CW_1, CW_2, \ldots, CW_p$. Those words are followed by the words $CW_{p+1}$ to $CW_n$ that act as parity words. An error correction step can thus be carried out on the p+1 words $\alpha_{def}$ and $CW_1$ to $CW_p$. Thus, if the value for $\alpha_{def}$ appears the be incorrect, it can be corrected by the correction unit 17. In this way the packet CP' supplied to the input 16 can be corrected so as to obtain a corrected packet CP' at the output 18.

Figure 8:
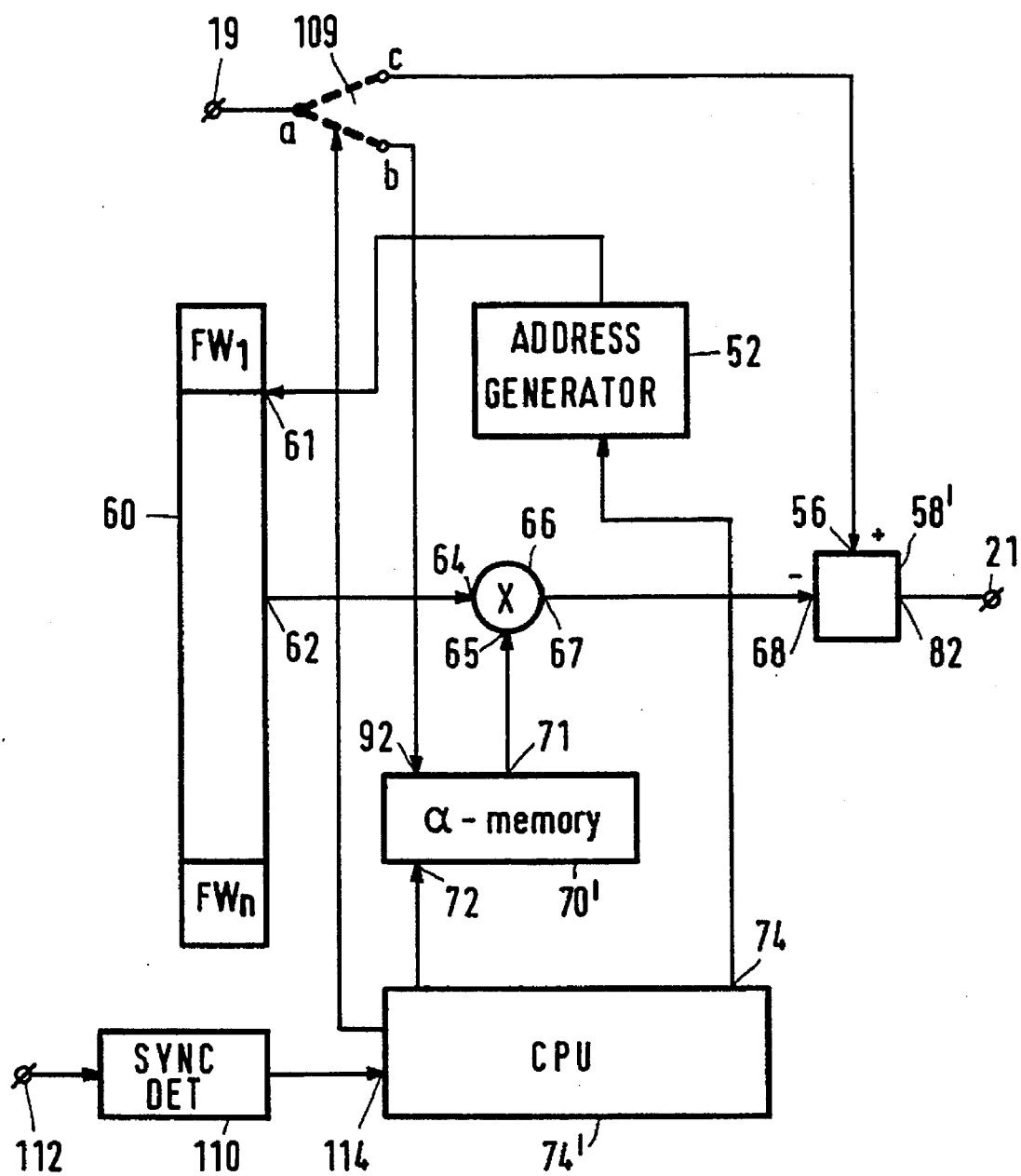
FIG. 8 shows an embodiment of a channel decoding unit in a reproducing apparatus.

The channel decoder unit 20 given in FIG. 1b will now be further discussed with reference to the embodiment schematically shown in FIG. 8. The channel decoder unit 20 looks a little bit like the channel encoder unit of FIG. 6, and comprises memories 60 and 70', address generator 52, multiplier 66 and a subtractor unit 58' instead of the adder 58. The memory 60 has the same n fixed dam words $FW_1$ to $FW_n$ stored as the memory 60 in FIG. 6. A controllable switch 109 is present, a first terminal a of which is coupled to the input 19 of the channel decoding unit, a second terminal 13 of which is coupled to the input 92 of the memory 70', and a third terminal c of which is coupled to an input 56 of the subtractor unit 58'. The memory 70' is for storing one value for $\alpha_{def}$.

Upon receiving a corrected packet CP', the CPU 74' generates a control signal for the switch 109, so that it is set in the position a-b. The value for $\alpha_{def}$ can now be loaded in the memory 70' under the influence of a control signal supplied by the CPU 74' to the input 72. Under the influence of a second control signal, the switch 109 is placed in the position a-c, so that the subsequent datawords $CW_i$ are supplied to the subtractor 58'. Under the influence of a control signal to the address generator 52, addresses are generated and supplied to the memory 60, so that the fixed datawords $FW_i$ are subsequently applied to the multiplier 66.

The channel decoder unit 20 thus carries out the following calculation in the previously described Galois field $GF(2^m)$:

$$RW_i = CW_i - \alpha_{def} FW_i.$$

As a result, reconverted datawords $RW_i$ that are a replica of the original datawords $DW_i$ occur at the output 21.

As a result a replica of the original datasignal, as applied to the input 1 of the recording apparatus is obtained at the output 22 of the reproducing apparatus.

In a further embodiment, it is possible to carry out a more complex channel encoding in the channel encoder unit 6, such as calculating the converted words by means of the equation:

$$CW_i = DW_i + \alpha FW_i + \beta GW_i.$$

Now, two fixed packets $FW_i$ and $GW_i$ are present, and a value for $\alpha_{def}$ and $\beta_{def}$ are calculated so as to enable a conversion in accordance with the above formula. Adding one or more terms, such as the β-term, results in more freedom of converting the digital data words such that the same constraints as described in the foregoing, as well as other constraints (if present), can be satisfied.

It should be noted that the invention has been explained with reference to an embodiment of the transmitter and receiver apparatus in the form of a recording and reproducing apparatus for recording and reproducing a digital data signal on/from a magnetic record carrier. The invention is however not restricted to this application, and is also applicable to recording/reproducing on/from optical record carriers, or applicable to transmission systems for transmitting the digital data signal via a wireless transmission channel as an example, such as in the case of a digital audio broadcast channel.

We claim:

1. A transmitter apparatus for transmitting a digital data signal via a transmission medium, the transmitter apparatus comprising:

input means for receiving a digital data signal;

error protection encoding means for carrying out error protection encoding on the digital data signal so as to obtain an error protection encoded digital data signal, the error protection encoding means being adapted to carry out error protection encoding on packets of p m-bit digital words in the digital data signal so as to obtain error protection encoded packets of n m-bit digital words making up the error protection encoded digital signal, where n, m and p are integers larger than 1, and n>p;

channel encoding means for converting the error protection encoded digital data signal into a channel encoded digital data signal, the channel encoding means being adapted to convert the error protection encoded packets of n digital words into converted packets of digital words to form the channel encoded digital data signal, and including:

generator means for supplying a fixed auxiliary packet having the length of n digital words, calculation means for calculating in a Galois field $GF(2^m)$ a converted digital word in accordance with the formula $DW_i + \alpha.FW_i$, where $DW_i$ is the binary value corresponding to the i-th digital word in the packet to be converted, $FW_i$ is the fixed binary value corresponding to the i-th digital word in the fixed auxiliary packet, α is the binary value of a multiplier word having more than one bit, and the converted digital word is the i-th converted digital word in the converted packet of digital words, where i is an integer value running from 1 to n, and digital sum value determining means for determining a digital sum value of at least a converted packet in the serial datastream of converted packets of digital words that form the channel encoded digital data signal, wherein the calculation means is adapted to determine a value $\alpha_{def}$ for each packet of digital words converted into a converted packet of digital words, and the channel encoding means is further adapted to combine $\alpha_{def}$ with the converted digital words obtained by the Galois field $GF(2^m)$ calculation of $DW_i + \alpha_{def} FW_i$ so as to obtain the converted packet of digital words, the value $\alpha_{def}$ for α being such that a running digital sum value of the serial datastream of the converted packet shows a desired pattern as a function of time; and transmission means for applying the channel encoded digital data signal to the transmission medium.

2. The transmitter apparatus as claimed in claim 1, wherein the channel encoding means further includes sync word generator means for generating a sync word for each of the converted packets of digital words, and the channel encoding means is further adapted to combine the sync word, $\alpha_{def}$ and the converted digital words obtained by the Galois field $GF(2^m)$ calculation of $DW_i + \alpha_{def} FW_i$ so as to obtain the converted packet of digital words.

3. The transmitter apparatus as claimed in claim 1, wherein the value $\alpha_{def}$ is determined such that the converted packet of digital words is substantially DC free.

4. The transmitter apparatus as claimed in claim 1, wherein the value $\alpha_{def}$ is determined such that the minimum run length in the serial datastream of the converted packets is larger than a second value.

5. The transmitter apparatus as claimed in claim 1, wherein the n-p fixed binary values $FW_{p+1}$ to $FW_n$ of the fixed auxiliary packet have been obtained by an error protection encoding step carried out on the following packet of p+1 binary values:

$$['1', FW_1, FW_2, \ldots, FW_p]$$

where '1' is the m-bit digital word denoting the decimal value '1'.

6. A method for transmitting the channel encoded data signal to be carried out in the transmitter apparatus as claimed in claim 1.

7. The transmitter apparatus as claimed in claim 1, wherein the transmitter apparatus is in the form of a recording apparatus for recording the digital data signal in a track on a record carrier, and the transmission means is in the form of recording means for recording the channel encoded digital data signal on the record carrier.

8. A record carrier obtained by the transmitter apparatus as claimed in claim 7, comprising the channel encoded data signal in a track on the record carrier, the channel encoded data signal including converted packets, a converted packet including a value for $\alpha_{def}$ and the n converted digital words.

9. A transmitter apparatus for transmitting a digital data signal via a transmission medium, the transmitter apparatus comprising:

input means for receiving a digital data signal;

error protection encoding means for carrying out error protection encoding on the digital data signal so as to obtain an error protection encoded digital data signal, the error protection encoding means being adapted to carry out error protection encoding on packets of p m-bit digital words in the digital data signal so as to obtain error protection encoded packets of n m-bit digital words making up the error protection encoded digital data signal, where n, m and p are integers larger than 1, and n>p;

channel encoding means for converting the error protection encoded digital data signal into a channel encoded digital data signal, the channel encoding means being adapted to convert the error protection encoded packets of n digital words into converted packets of digital words to form the channel encoded digital data signal, and including:

generator means for supplying a fixed auxiliary packet having the length of n digital words, and calculation means for calculating in a Galois field $GF(2^m)$ a converted digital word in accordance with the formula $DW_i + \alpha \cdot FW_i$, where $DW_i$ is the binary value corresponding to the i-th digital word in the packet to be converted, $FW_i$ is the fixed binary value corresponding to the i-th digital word in the fixed auxiliary packet, $\alpha$ is the binary value of a multiplier word having more than one bit, and the converted digital word is the i-th converted digital word in the converted packet of digital words, where i is an integer value running from 1 to n, wherein the calculation means is adapted to determine a value $\alpha_{def}$ for each packet of digital words converted into a converted packet of digital words, and the channel encoding means is further adapted to combine $\alpha_{def}$ with the converted digital words obtained by the Galois field $GF(2^m)$ calculation of $DW_i + \alpha_{def} \cdot FW_i$ so as to obtain the converted packet of digital words, the value $\alpha_{def}$ being determined such that the maximum run length in the serial datastream of the converted packets of digital words is smaller than a first value; and transmission means for applying the channel encoded digital data signal to the transmission medium.

10. The transmitter apparatus as claimed in claim 9, wherein the value $\alpha_{def}$ is determined such that the minimum run length in the serial datastream of the converted packets is larger than a second value.

11. The transmitter apparatus as claimed in claim 9, wherein the n-p fixed binary values $FW_{p+1}$ to $FW_n$ of the fixed auxiliary packet have been obtained by an error protection encoding step carried out on the following packet of p+1 binary values:

$$['1', FW_1, FW_2, \ldots, FW_p],$$

where '1' is the m-bit digital word denoting the decimal value '1'.

12. A method for transmitting the channel encoded data signal to be carried out in the transmitter apparatus as claimed in claim 9.

13. A transmitter apparatus for transmitting a digital data signal via a transmission medium, the transmitter apparatus comprising:

input means for receiving a digital data signal;

error protection encoding means for carrying out error protection encoding on the digital data signal so as to obtain an error protection encoded digital data signal, the error protection encoding means being adapted to carry out error protection encoding on packets of p m-bit digital words in the digital data signal so as to obtain error protection encoded packets of n m-bit digital words making up the error protection encoded digital data signal, where n, m and p are integers larger than 1, and n>p;

channel encoding means for converting the error protection encoded digital data signal into a channel encoded digital data signal, the channel encoding means being adapted to convert the error protection encoded packets of n digital words into converted packets of digital words to form the channel encoded digital data signal, and including:

generator means for supplying a fixed auxiliary packet having the length of n digital words, calculation means for calculating in a Galois field $GF(2^m)$ a converted digital word in accordance with the formula $DW_i + \alpha \cdot FW_i$, where $DW_i$ is the binary value corresponding to the i-th digital word in the packet to be converted, $FW_i$ is the fixed binary value corresponding to the i-th digital word in the fixed auxiliary packet, $\alpha$ is the binary value of a multiplier word having more than one bit, and the converted digital word is the i-th converted digital word in the converted packet of digital words, where i is an integer value running from 1 to n, the calculation means being adapted to determine a value $\alpha_{def}$ for each packet of digital words converted into a converted packet of digital words, and sync word generator means for generating a sync word for each of the converted packets of digital words, wherein the channel encoding means is further adapted to combine the sync word, $\alpha_{def}$ and the converted digital words obtained by the Galois field $GF(2^m)$ calculation of $DW_i + \alpha_{def} FW_i$ so as to obtain the converted packet of digital words, and the value $\alpha_{def}$ is determined such that, except for the sync word in the converted packet of digital words, the converted packet does not have a bit pattern that corresponds to the bit pattern of the sync word; and transmission means for applying the channel encoded digital data signal to the transmission medium.

14. The transmitter apparatus as claimed in claim 13, wherein the n-p fixed binary values $FW_{p+1}$ to $FW_n$ of the fixed auxiliary packet have been obtained by an error protection encoding step carried out on the following packet of p+1 binary values:

$['1', FW_1, FW_2, \ldots, FW_p]$ where '1' is the m-bit digital word denoting the decimal value '1'.

15. A method for transmitting the channel encoded data signal to be carried out in the transmitter apparatus as claimed in claim 13.

16. A transmitter apparatus for transmitting a digital data signal via a transmission medium, the transmitter apparatus comprising:

input means for receiving a digital data signal;

error protection encoding means for carrying out error protection encoding on the digital data signal so as to obtain an error protection encoded digital data signal, the error protection encoding means being adapted to carry out error protection encoding on packets of p m-bit digital words in the digital data signal so as to obtain error protection encoded packets of n m-bit digital words making up the error protection encoded digital data signal, where n, m and p are integers larger than 1, and n>p;

channel encoding means for converting the error protection encoded digital data signal into a channel encoded digital data signal, the channel encoding means being adapted to convert the error protection encoded packets of n digital words into converted packets of digital words to form the channel encoded digital data signal, and including:

generator means for supplying a first and a second fixed auxiliary packet having the length of n digital words, calculation means for calculating in a Galois field $GF(2^m)$ a converted digital word in accordance with the formula $DW_i + \alpha.FW_i + \beta.GW_i$, where $DW_i$ is the binary value corresponding to the i-th digital word in the packet to be converted, $FW_i$ is the fixed binary value corresponding to the i-th digital word in the first fixed auxiliary packet, $GW_i$ is the fixed binary value corresponding to the i-th digital word in the second fixed auxiliary packet, $\alpha$ is the binary value of a first multiplier word having more than one bit, $\beta$ is the binary value of a second multiplier word having more than one bit, and the converted digital word is the i-th converted digital word in the converted packet of digital words, where i is an integer value running from 1 to n, and digital sum value determining means for determining a digital sum value of at least a converted packet in the serial datastream of converted packets of digital words that form the channel encoded digital data signal, wherein the calculation means is adapted to determine values $\alpha_{def}$ and $\beta_{def}$ for each packet of digital words converted into a converted packet of digital words, and the channel encoding means is further adapted to combine $\alpha_{def}$ and $\beta_{def}$ with the converted digital words obtained by the Galois field $GF(2^m)$ calculation of $DW_i + \alpha_{def}.FW_i + \beta_{def}.GW_i$ so as to obtain said converted packet of digital words, the values $\alpha_{def}$ for $\alpha$ and $\beta_{def}$ for $\beta$ being such that a running digital sum value of the serial datastream of the converted packets shows a desired pattern as a function of time; and transmission means for applying the channel encoded digital data signal to the transmission medium.

17. A method for transmitting the channel encoded data signal to be carried out in the transmitter apparatus as claimed in claim 16.

18. A receiver apparatus for receiving a digital data signal that has been transmitted as a serial datastream of converted packets via a transmission medium, the receiver apparatus comprising:

receiving means for receiving a transmission signal from the transmission medium so as to obtain the serial datastream of converted packets at an output thereof;

channel decoding means for converting a channel encoded signal into a channel decoded signal; and error correction decoding means for carrying out error detection and correction on a signal applied to an input thereof, the input of the error correction decoding means being coupled to the output of the receiving means, an output of the error correction decoding means being coupled to an input of the channel decoding means, and the digital data signal being available at an output of the channel decoding means;

wherein the channel decoding means is adapted to reconvert converted packets of digital words, each converted packet including an $\alpha$ value and n m-bit converted digital words, where n and m are integers larger than 1, and the channel decoding means includes:

retrieval means for retrieving the $\alpha$ value, one $\alpha$ value for each of the converted packets, from the information applied to the input of the channel decoding means, generator means for supplying a fixed auxiliary packet also having the length of n digital words, and calculation means for calculating in a Galois field $GF(2^m)$ reconverted words in accordance with the formula $CW_i - \alpha.FW_i$, where $CW_i$ is the binary value corresponding to the i-th digital word in the converted packet, and $FW_i$ is the a fixed binary value corresponding to the i-th digital word in the fixed auxiliary packet, where i is an integer value running from 1 to n.

19. A method for receiving the channel encoded data signal to be carried out in the receiver apparatus as claimed in claim 18.

20. The receiver apparatus as claimed in claim 18, wherein the n converted digital words in a converted packet were original obtained by a Galois field $GF(2^m)$ calculation using a formula which at least included $DW_i + \alpha.FW'_i$, where $DW_i$ is the binary value corresponding to i-th digital word of n digital words which were converted into the converted packet, and $FW'_i$ is the fixed binary value corresponding to the i-th digital word of n fixed digital words in an additional fixed auxiliary packet; and the digital words in the fixed auxiliary packet are the same as the digital words in the additional fixed auxiliary packet.

21. A method for receiving the channel encoded data signal to be carried out in the receiver apparatus as claimed in claim 20.

22. The receiving apparatus as claimed in claim 18, wherein the receiver apparatus is in the form of a reproducing apparatus for reproducing the digital data signal from a track on a record carrier, and the receiving means in the receiver apparatus is in the form of reproducing means for reproducing the channel encoded digital data signal from the record carrier.

23. A method for receiving the channel encoded data signal to be carried out in the receiver apparatus as claimed in claim 22.

24. A receiving apparatus for receiving a digital data signal that has been transmitted as a serial datastream of converted packets via a transmission medium, the receiver apparatus comprising:

receiving means for receiving a transmission signal from the transmission medium so as to obtain the serial datastream of converted packets at an output thereof;

channel decoding means for converting a channel encoded signal into a channel decoded signal; and error correction decoding means for carrying out error detection and correction on a signal applied to an input thereof, the input of the error correction decoding means being coupled to the output of the receiving means, an output of the error correction decoding means being coupled to an input of the channel decoding means, and the digital data signal being available at an output of the channel decoding means;

wherein the channel decoding means is adapted to reconvert converted packets of digital words, each converted packet including an $\alpha$ value, a $\beta$ value and n m-bit converted digital words, where n and m are integers larger than 1, and the channel decoding means includes:

retrieval means for retrieving the $\alpha$ and $\beta$ values, one $\alpha$ and one value for each of the converted packets, from the information applied to the input of the channel decoding means, generator means for supplying a first and a second fixed auxiliary packet also having the length of n digital words, and calculation means for calculating in a Galois field $GF(2^m)$ reconverted words in accordance with the formula $CW_i - \alpha.FW_i - \beta.GW_i$, where $CW_i$ is the binary value corresponding to the i-th digital word in the converted packet, $FW_i$ is the fixed binary value corresponding to the i-th digital word in the first fixed auxiliary packet, and $GW_i$ is the fixed binary value corresponding to the i-th digital word in the second fixed auxiliary packet, where i is an integer value running from 1 to n.

25. A method for receiving the channel encoded data signal to be carried out in the receiver apparatus as claimed in claim 24.

26. A method for processing a digital data signal for transmission via a transmission medium, the method comprising:

carrying out an error protection encoding on a digital signal so as to obtain an error protection encoded digital signal by carrying out error protection encoding of packets of p m-bit digital words included in the digital signal so as to obtain error protection encoded packets of n m-bit digital words making up the error protection encoded digital signal, where n, m and p are integers larger than 1, and n>p; and converting the error protection encoded digital signal into a channel encoded digital signal by converting the error protection encoded packets of n digital words into converted packets of digital words to form the channel encoded digital data signal, which conversion includes:

supplying a fixed auxiliary packet having the length of n digital words, and calculating in a Galois field $GF(2^m)$ a converted digital word in accordance with a formula which at least includes $DW_i + \alpha.FW_i$, where $DW_i$ is the binary value corresponding to the i-th digital word in the packet to be converted, $FW_i$ is the fixed binary value corresponding to the i-th digital word in the fixed auxiliary packet, $\alpha$ is the binary value of a multiplier word including more than one bit, and the converted digital word is the i-th converted digital word in the converted packet of digital words, where i is an integer value running from 1 to n, such calculation including determining at least a value $\alpha_{def}$ for each packet of digital words converted into a converted packet of digital words;

wherein the channel encoding further includes combining $\alpha_{def}$ with the converted digital words obtained by the Galois field $GF(2^m)$ calculation in accordance with the formula so as to obtain the converted packet of digital words.

27. A method for obtaining a digital data signal that has been transmitted as a serial datastream of converted packets via a transmission medium, the method comprising:

carrying out error detection and correction on the serial datastream of converted packets obtained from the transmission medium to obtain a channel encoded signal; and converting the channel encoded signal into a channel decoded signal by reconverting converted packets of digital words included in the channel encoded signal, each converted packet having an $\alpha$ value and n m-bit converted digital words, where n and m are integers larger than 1, which conversion includes:

retrieving the $\alpha$ value, one $\alpha$ value for each of the converted packets, from the converted packets, supplying a fixed auxiliary packet having the length of n digital words, and calculating in a Galois field $GF(2^m)$ reconverted words in accordance with a formula which includes at least the expression $CW_1 - \alpha.FW_i$, where $CW_i$ is the binary value corresponding to the i-th digital word in the converted packet and $FW_i$ is the fixed binary value corresponding to the i-th digital word in the fixed auxiliary packet, where i is an integer value running from 1 to n.

28. An apparatus for processing a digital data signal for transmission via a transmission medium, the apparatus comprising:

error protection encoding means for carrying out an error protection encoding on a digital signal so as to obtain an error protection encoded digital signal by carrying out error protection encoding of packets of p m-bit digital words included in the digital signal so as to obtain error protection encoded packets of n m-bit digital words making up the error protection encoded digital signal, where n, m and p are integers larger than 1, and n>p; and channel encoding means for converting the error protection encoded digital signal into a channel encoded digital signal by converting the error protection encoded packets of n digital words into converted packets of digital words to form the channel encoded digital data signal, the channel encoding means including:

generator means for supplying a fixed auxiliary packet having the length of n digital words, and calculation means for calculating in a Galois field $GF(2^m)$ a converted digital word in accordance with a formula which at least includes $DW_i + \alpha.FW_i$, where $DW_i$ is the binary value corresponding to the i-th digital word in the packet to be converted, $FW_i$ is the fixed binary value corresponding to the i-th digital word in the fixed auxiliary packet, $\alpha$ is the binary value of a multiplier word including more than one bit, and the converted digital word is the i-th converted digital word in the converted packet of digital words, where i is an integer value running from 1 to n;

wherein the calculation means determines at least a value $\alpha_{def}$ for each packet of digital words converted into a converted packet of digital words, and the channel encoding means combines $\alpha_{def}$ with the converted digital words obtained by the Galois field $GF(2^m)$ calculation in accordance with the formula so as to obtain the converted packet of digital words.

29. An apparatus for obtaining a digital data signal that has been transmitted as a serial datastream of converted packets via a transmission medium, the apparatus comprising:

error correction decoding means for carrying out error detection and correction the serial datastream of converted packets obtained from the transmission medium to obtain a channel encoded signal; and channel decoding means for converting the channel encoded signal into a channel decoded signal by reconverting converted packets of digital words included in the channel encoded signal, each converted packet having an $\alpha$ value and n m-bit converted digital words, where n and m are integers larger than 1, the channel decoding means including:

retrieval means for retrieving the $\alpha$ value, one $\alpha$ for each of the converted packets, from the converted packets, generator means for supplying a fixed auxiliary packet having the length of n digital words, and calculation means for calculating in a Galois field $GF(2^m)$ reconverted words in accordance with a formula which includes at least the expression $CW_i - \alpha.FW_i$, where $CW_i$ is the binary value corresponding to the i-th digital word in the converted packet and $FW_i$ is the fixed binary value corresponding to the i-th digital word in the fixed auxiliary packet, where i is an integer value running from 1 to n.

* * * * *